United States Patent
Choi

(10) Patent No.: US 7,554,874 B2
(45) Date of Patent: Jun. 30, 2009

(54) METHOD AND APPARATUS FOR MAPPING MEMORY

(75) Inventor: Sung-kyu Choi, Bucheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 271 days.

(21) Appl. No.: 11/540,715

(22) Filed: Oct. 2, 2006

(65) Prior Publication Data

US 2007/0076511 A1 Apr. 5, 2007

(30) Foreign Application Priority Data

Oct. 1, 2005 (KR) .................. 10-2005-0092665

(51) Int. Cl.
*G11C 8/00* (2006.01)
(52) U.S. Cl. .................. 365/230.04; 365/230.03; 365/230.09; 365/235
(58) Field of Classification Search ............ 365/230.04, 365/230.03, 230.09, 235
See application file for complete search history.

(56) References Cited

U.S. PATENT DOCUMENTS

| | | | | |
|---|---|---|---|---|
| 5,619,471 A | * | 4/1997 | Nunziata | 365/230.03 |
| 5,717,461 A | | 2/1998 | Hoogenboom | |
| 6,026,473 A | * | 2/2000 | Cross et al. | 711/157 |
| 6,076,136 A | * | 6/2000 | Burroughs et al. | 711/5 |
| 6,404,697 B1 | * | 6/2002 | Ryu et al. | 365/230.04 |
| 6,452,867 B1 | * | 9/2002 | Ryan | 365/233.13 |
| 2005/0185937 A1 | | 8/2005 | Comer et al. | |

FOREIGN PATENT DOCUMENTS

KR 1999-0060482 A 7/1999
WO WO 2004/059645 A1 7/2004

* cited by examiner

*Primary Examiner*—Pho M. Luu
(74) *Attorney, Agent, or Firm*—Sughrue Mion, PLLC

(57) ABSTRACT

A memory mapping method is provided for writing block data composed of a plurality of lines in first and second memories, each memory including at least two banks of the same number. The method maps the memories such that continuous even-numbered lines are written in different banks of different memories, and continuous odd-numbered lines are written in different banks of different memories when the block data is motion-compensated in a frame mode or a field mode. Accordingly, bank interleaving can be carried out in the respective memories and two memory channels can be simultaneously used to improve bus utilization efficiency and memory channel utilization efficiency.

21 Claims, 10 Drawing Sheets

METHOD AND APPARATUS FOR MAPPING MEMORY

CROSS-REFERENCE TO RELATED PATENT APPLICATION

This application claims priority from Korean Patent Application No. 10-2005-0092665, filed on Oct. 1, 2005, in the Korean Intellectual Property Office, the disclosure of which is incorporated herein in its entirety by reference.

BACKGROUND OF THE INVENTION

1. Field of the Invention

Methods and apparatuses consistent with the present invention relate to mapping of a memory, and more particularly, to memory mapping having improved both bus utilization efficiency and memory channel utilization efficiency.

2. Description of the Related Art

A decoder used in a high definition (HD) video environment frequently has to access an external memory, and thus the bus utilization efficiency of the decoder has to be improved for more efficient real time processing.

FIG. 1 is a block diagram of a related art multi-format decoder. Referring to FIG. 1, the related art multi-format decoder includes a syntax processor SP, a transform processor TP and a motion vector processor MP. Detailed structures and operations of these processors are well known in the art, thus detailed explanations thereof are omitted.

The motion vector processor MP which performs inter-motion compensation or loop filtering reads a large quantity of data from external memories M0 and M1 through buses, and writes a large quantity of data to the external memories M0 and M1. Accordingly, the external memory access time of the motion vector processor MP is an important factor for determining the entire processing time of the multi-format decoder. Specifically, an inter read module (not shown) of the motion vector processor MP reads reference data stored in the memories M0 and M1. Thus, in order to reduce the processing time of the multi-format decoder, it is very important to improve bus utilization efficiency and memory channel utilization efficiency between the inter-read module and the memories M0 and M1.

FIG. 2 illustrates the structures of related art memories M0 and M1 including a plurality of banks. Referring to FIG. 2, each of the memories M0 and M1 include four banks. A currently used general memory includes four banks, but a memory having eight banks has been developed. Dividing a memory into a plurality of banks enables overlapping of a command transmission period in which data addresses are transmitted, and a data transmission period in which data is transmitted when the data is written in (or read from) different banks. Accordingly, bank utilization efficiency can be improved through bank interleaving. This will be explained in more detail with reference to FIGS. 3A and 3B.

FIG. 3A illustrates operation timing when bank interleaving does not occur and FIG. 3B illustrates operation timing when bank interleaving occurs. Referring to FIG. 3A, when data is written in (or read from) a bank, a command transmission period is inserted between data transmission periods when the data is continuously written (or read). In this case, the command transmission period functions as a gap between the data transmission periods, which results in a decrease in bus utilization efficiency.

Referring to FIG. 3B, when data is written in (or read from) two banks, the data transmission period of the first bank and the command transmission period of the second bank can be overlapped with each other and the command transmission period of the first bank and the data transmission period of the second bank can be overlapped with each other even when the data is continuously written (or read). Consequently, bank interleaving occurs between the banks to eliminate a gap between the data transmission periods. This enables continuous data transmission to improve bus utilization efficiency.

FIGS. 4A, 4B, and 4C illustrate an operation of a motion vector processor MP to motion-compensate block data of a video frame in a frame mode or a field mode. FIG. 4A illustrates the motion vector processor MP and the memories M0 and M1 connected to the motion vector processor MP through buses, FIG. 4B illustrates the block data composed of a plurality of lines 0, 1, 2, 3, . . . in the video frame, and FIG. 4C illustrates a related art memory mapping format in which the lines constructing the block data are written in the two memories M0 and M1.

Referring to FIG. 4C, even-numbered lines 0, 2, 4, 6, 8, 10, 12, 14, . . . among the lines constructing the block data are written in the memory M0 and odd-numbered lines 1, 3, 5, 7, 9, 11, 13, 15, . . . are written in the memory M1. Accordingly, only the even-numbered lines 0, 2, 4, 6, 8, 10, 12, 14, . . . are written (or read) via the bus between the motion vector processor MP and the memory M0 of FIG. 4A and only odd-numbered lines 1, 3, 5, 7, 9, 11, 13, 15, . . . are written (or read) via the bus between the motion vector processor MP and the memory M1.

When motion compensation is carried out in the field mode, however, only the even-numbered lines or odd-numbered lines are accessed. Thus, the bus between the motion vector processor MP and the memory M1 is not utilized when only the even-numbered lines are accessed and the bus between the motion vector processor MP and the memory M0 is not utilized when only the odd-numbered lines are accessed. Accordingly, memory channel utilization efficiency is deteriorated.

SUMMARY OF THE INVENTION

The present invention provides a memory mapping method and apparatus capable of improving both bus utilization efficiency and memory channel utilization efficiency by simultaneously using two memory channels and enabling bank interleaving in the respective memory channels when block data composed of a plurality of lines is written in (or read from) two memories.

The present invention also provides a computer readable recording medium storing a program for executing the memory mapping method on a computer.

According to an aspect of the present invention, there is provided a memory mapping method for writing block data composed of a plurality of lines in first and second memories each including at least two banks of the same number, wherein contiguous even-numbered lines are written in different banks of different memories and contiguous odd-numbered lines are written in different banks of different memories when the block data is motion-compensated in a frame mode or a field mode.

According to another aspect of the present invention, there is provided a memory mapping method for writing block data composed of a plurality of lines in first and second memories each including an even number of banks which is more than two of the same number, the method comprising writing one line in a first write bank of the first memory; alternately writing two lines in the second memory and two lines in the first memory in a manner that two lines are respectively written in two banks of the first memory and two lines are respectively written in two banks of the second memory such that lines of the block data are uniformly distributed in the banks of the first and second memories other than a final write bank of the first memory; writing one line in the final write bank of the first memory; and repeating the writing of one line in the first write bank of the first memory, the alternate writing of two lines and the writing of one line in the final write bank of the first memory, wherein the writing of the block data is stopped when there is no line left for data to be written.

According to another aspect of the present invention, there is provided a memory mapping method for writing block data composed of a plurality of lines in first and second memories, wherein each of the first and second memories include an odd number of banks greater than three, the memory mapping method comprising writing one line in a first write bank of the first memory; alternately writing two lines in the second memory and writing two lines in the first memory in a manner that two lines are respectively written in two banks of the second memory and two lines are respectively written in two banks of the first memory such that lines of the block data are uniformly distributed in the banks of the first and second memories other than a final write bank of the second memory; writing one line in the final write bank of the second memory; writing one line in a first write bank of the second memory; alternately writing two lines in the first memory and the second memory in a manner that the two lines are respectively written in two banks of each of the first and second memories such that lines of the block data are uniformly distributed in the banks of the first and second memories other than a final write bank of the first memory; writing one line in the final write bank of the first memory; and repeating the writing of one line in the first write bank of the first memory, the alternate writing of two lines, the writing of one line in the final write bank of the second memory, the writing of one line in the first write bank of the second memory, the alternate writing of two lines, and the writing of one line in the final write bank of the first memory, wherein the writing the block data is stopped when there is no line left data to be written.

According to another aspect of the present invention, there is provided a memory mapping apparatus for writing block data composed of a plurality of lines in first and second memories, each including at least two banks of the same number, which writes contiguous even-numbered lines in different banks of different memories and contiguous odd-numbered lines in different banks of different memories when the block data is motion-compensated in a frame mode or a field mode.

According to another aspect of the present invention, there is provided a memory mapping apparatus for writing block data composed of a plurality of lines in first and second memories each including an even number of banks which is more than two. The memory mapping apparatus writes one line in a first write bank of the first memory, alternately writes two lines in the second memory and two lines in the first memory in a manner that two lines are respectively written in two banks of the first memory and two lines are respectively written in two banks of the second memory such that lines of the block data are uniformly distributed in the banks of the first and second memories other than a final write bank of the first memory, writes one line in the final write bank of the first memory, and repeats the previous operations. The apparatus stops the block data writing operation when there is no line data left to be written.

According to another aspect of the present invention, there is provided a memory mapping apparatus for writing block data composed of a plurality of lines in first and second memories each including an even number of banks which is more than three. The memory mapping apparatus writes one line in a first write bank of the first memory, alternately writes two lines in the second memory and two lines in the first memory in a manner that two lines are respectively written in two banks of the first memory and two lines are respectively written in two banks of the second memory such that lines of the block data are uniformly distributed in the banks of the first and second memories other than a final write bank of the second memory, writes one line in the final write bank of the second memory, writes one line in a first write bank of the second memory, alternately writes two lines in the first memory and the second memory in a manner that two lines are respectively written in two banks of the first memory and two lines are respectively written in two banks of second memory such that lines of the block data are uniformly distributed in the banks of the first and second memories other than a final write bank of the first memory, writes one line in the final write bank of the first memory, and repeats the previous operations. The apparatus stops the block data writing operation when there is no line data left to be written.

According to another aspect of the present invention, there is provided a computer readable recording medium storing a program for executing the memory mapping method on a computer.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENTS OF THE INVENTION

Figure 1:
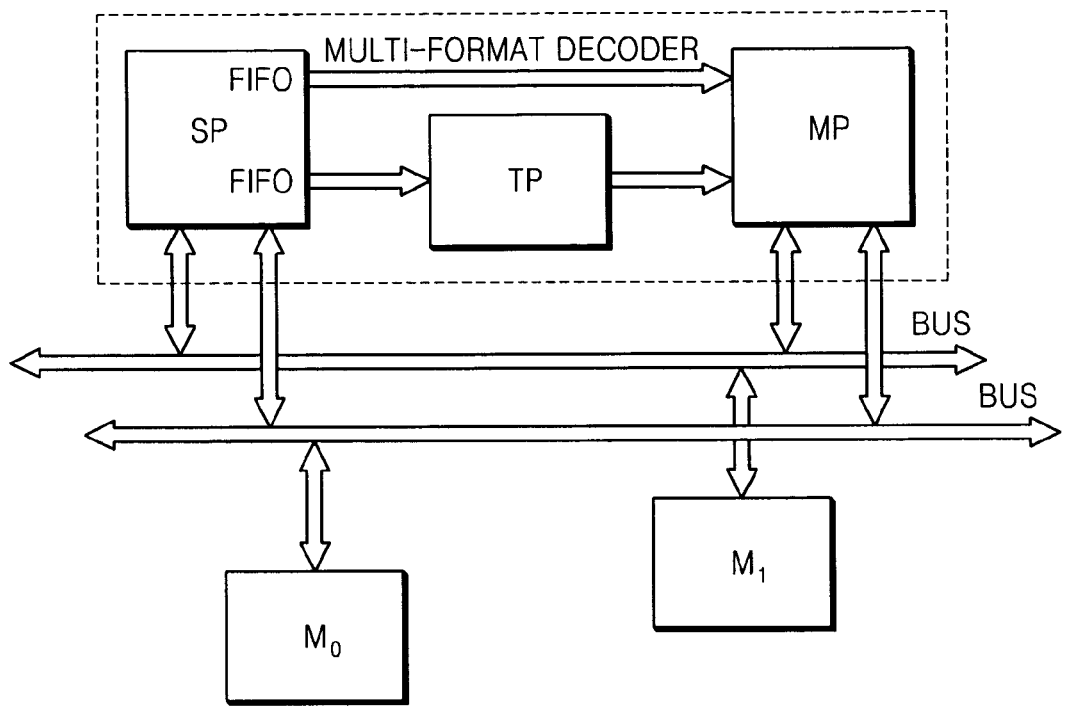
FIG. 1 is a block diagram of a related art multi-format decoder.
Figure 2:
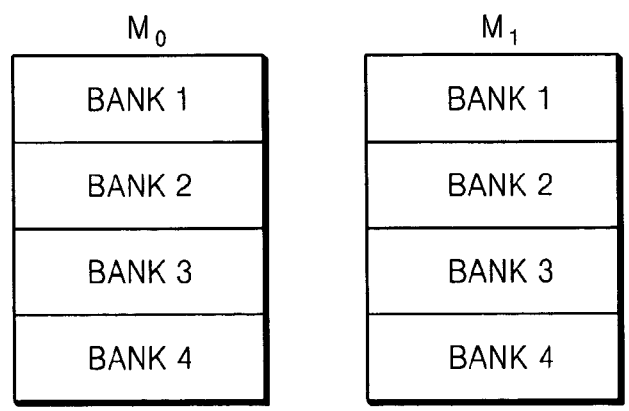
FIG. 2 illustrates a structure of a related art memory including a plurality of banks.
Figure 3A:
FIGS. 3A and 3B illustrate operation timing when bank interleaving does not occur and operation timing when bank interleaving occurs.
Figure 3B:
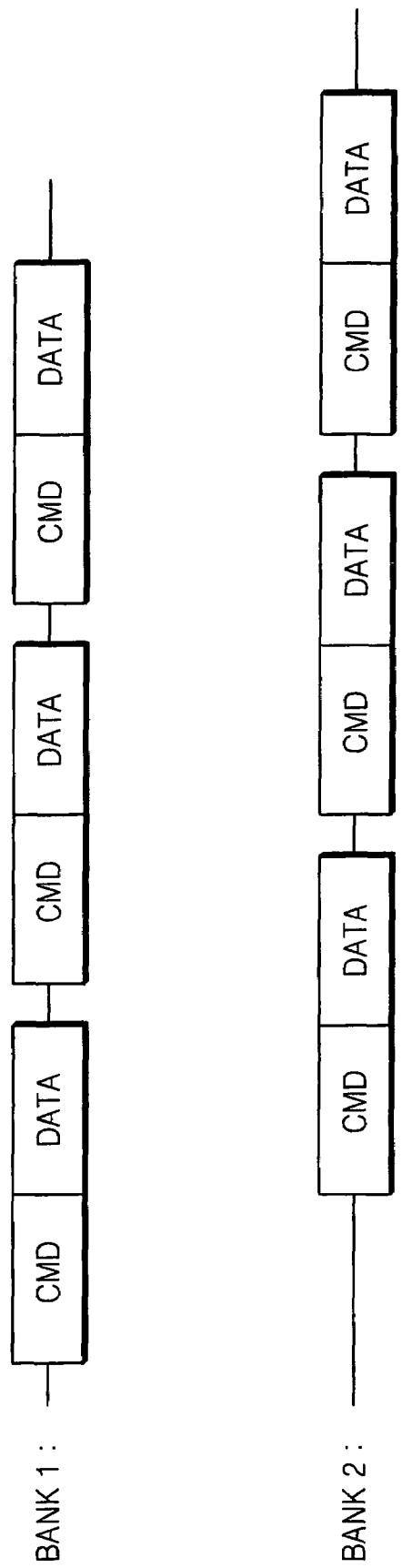

The present invention will now be described more fully with reference to the accompanying drawings, in which exemplary embodiments of the invention are shown. The invention may, however, be embodied in many different forms and should not be construed as being limited to the exemplary embodiments set forth herein; rather, these exemplary embodiments are provided so that this disclosure will be thorough and complete, and will fully convey the concept of the invention to those skilled in the art. Throughout the drawings, like reference numerals refer to like elements.

Figure 5A:
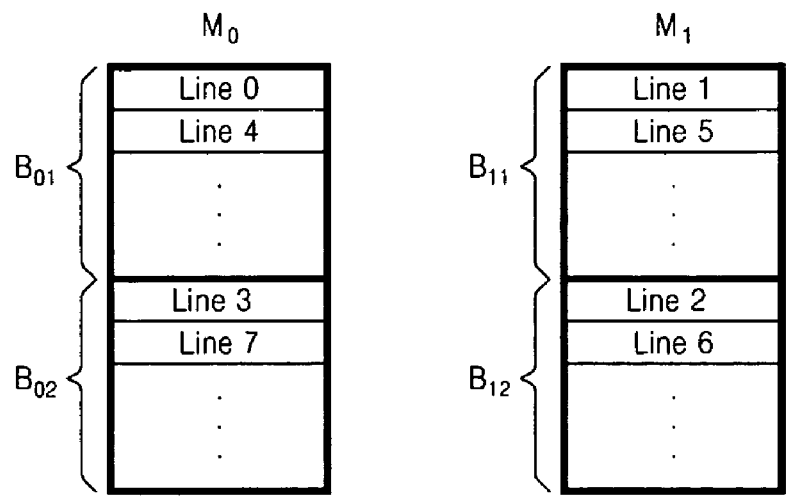
FIGS. 5A, 5B and 5C illustrate memory mapping formats in which lines constructing block data are written in two memories according to an exemplary embodiment of the present invention.
Figure 5B:
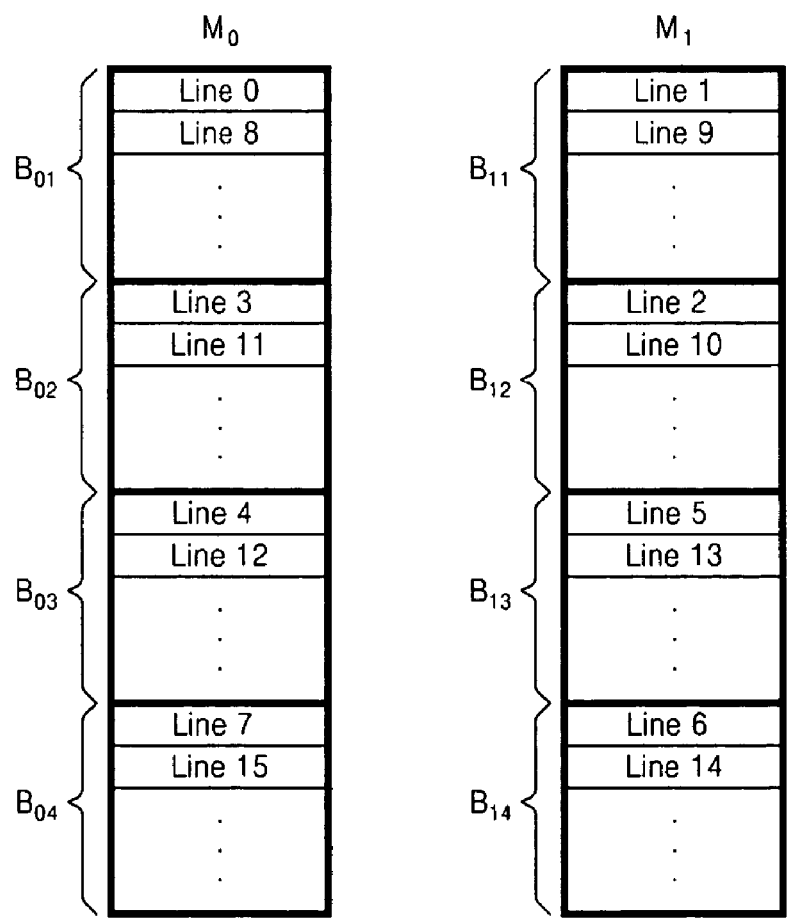

FIGS. 5A and 5B illustrate memory mapping formats in which lines constructing block data are written in two memories M0 and M1 according to an exemplary embodiment of the present invention. FIG. 5A illustrates a memory mapping format when each of the two memories M0 and M1 includes two banks, FIG. 5B illustrates a memory mapping format when each of the two memories M0 and M1 includes four banks, and FIG. 5C illustrates a memory mapping format when each of the two memories M0 and M1 includes three banks.

Figure 4A:
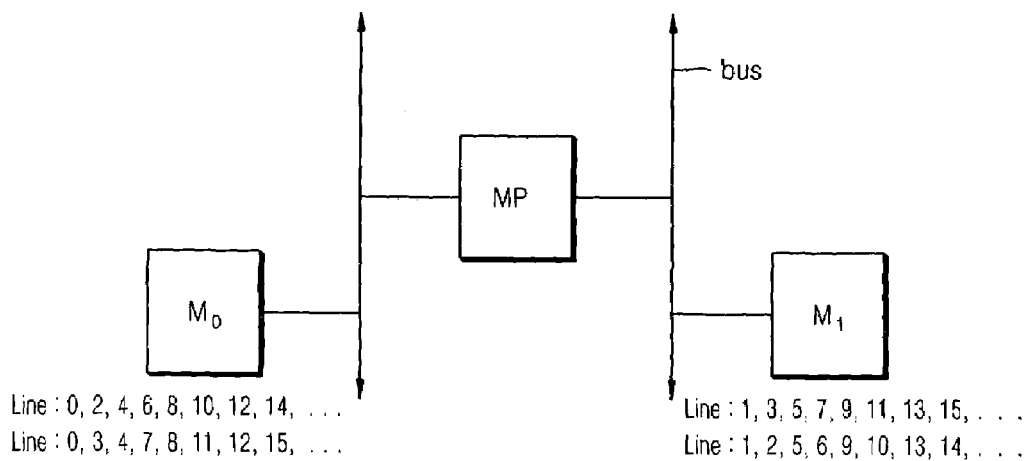
FIGS. 4A, 4B and 4C illustrate operation of a motion vector processor to motion-compensate block data of a video frame in a frame mode or a field mode.
Figure 4B:
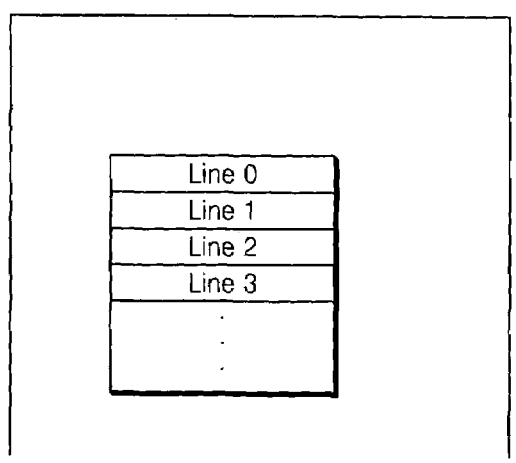
Figure 4C:
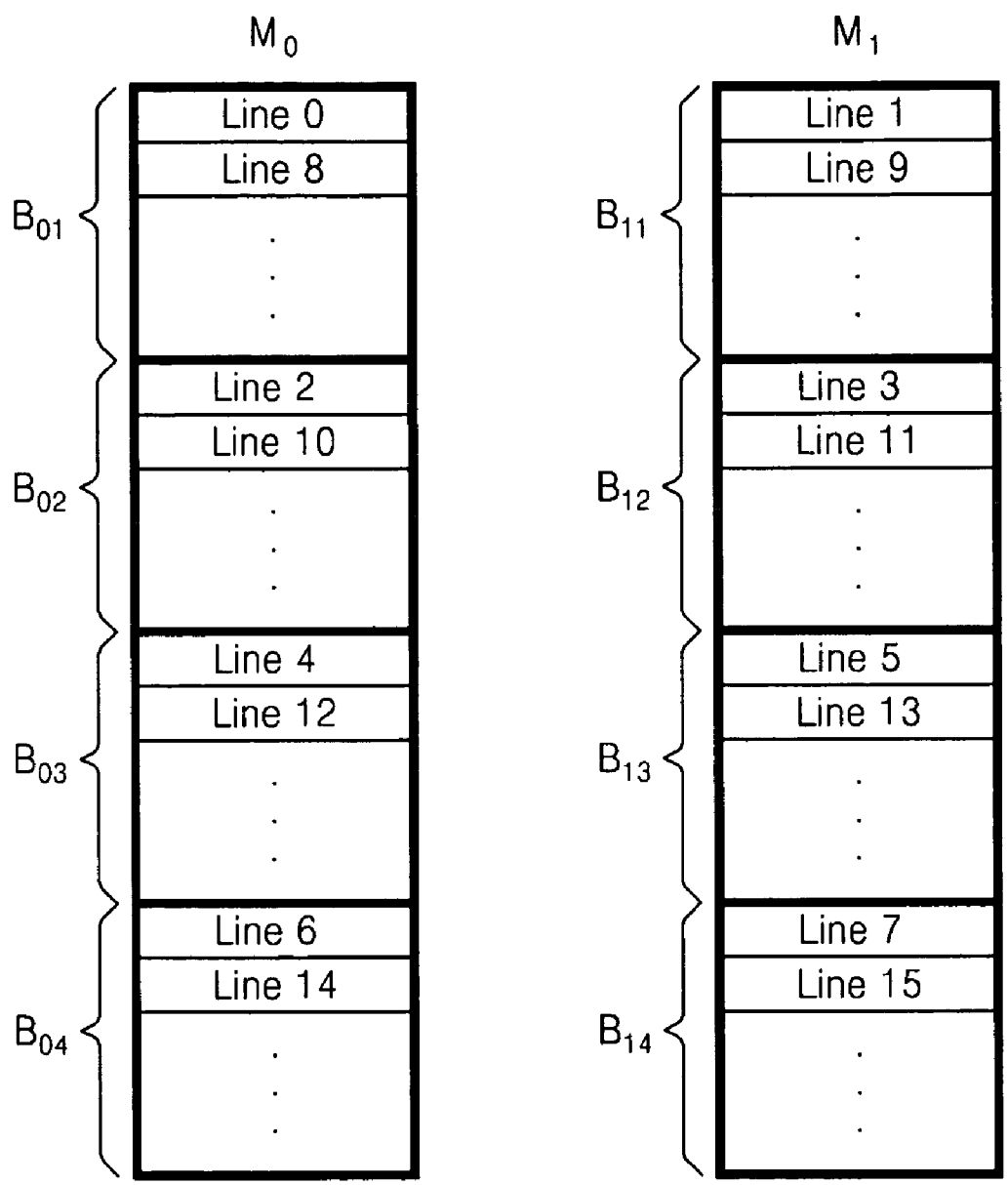

Referring to FIG. 5A, the memory M0 includes a bank B01 and a bank B02 and the memory M1 includes a bank B11 and a bank B12. Lines 0, 1, 2, 3, 4, 5, 6, 7, ... constructing block data are sequentially mapped to the banks B01, B11, B12, B02, B01, B11, B12, B02, ..., respectively. When this mapping result is applied to FIG. 4A, the lines 0, 3, 4, 7, ... are written in the memory M0 and the lines 1, 2, 5, 6, ... are written in the memory M1. Thus, both the bus between the motion vector processor MP and the memory M1 and the bus between the motion vector processor MP and the memory M0 can be utilized even when only the even-numbered lines or only the odd-numbered lines are accessed when motion compensation is carried out in the frame mode or the field mode. Consequently, bus utilization efficiency is improved. Furthermore, the banks accessed when the lines are written (or read) are continuously switched to enable bank interleaving. This also improves bus utilization efficiency.

Referring to FIG. 5B, the memory M0 includes a bank B01, a bank B02, a bank B03 and a bank B04 and the memory M1 includes a bank B11, a bank B12, a bank B13 and a bank B14. The lines 0, 1, 2, 3, 4, 5, 6, 7, 8, 9, 10, 11, 12, 13, 14, 15, ... constructing the block data are sequentially mapped to the banks B01, B11, B12, B02, B03, B13, B14, B04, B01, B11, B12, B02, B03, B13, B14, B04, ..., respectively. When this mapping result is applied to FIG. 4A, the lines 0, 3, 4, 7, 8, 11, 12, ... are written in the memory M0 and the lines 1, 2, 5, 6, 9, 10, 13, 14, ... are written in the memory M1. Thus, both the bus between the motion vector processor MP and the memory M1 and the bus between the motion vector processor MP and the memory M0 can be utilized even when only the even-numbered lines or only the odd-numbered lines are accessed when motion compensation is carried out in the frame mode or the field mode. Consequently, bus utilization efficiency is improved. Furthermore, the banks accessed when the lines are written (or read) are continuously switched to enable bank interleaving. This also improves bus utilization efficiency.

Figure 5C:
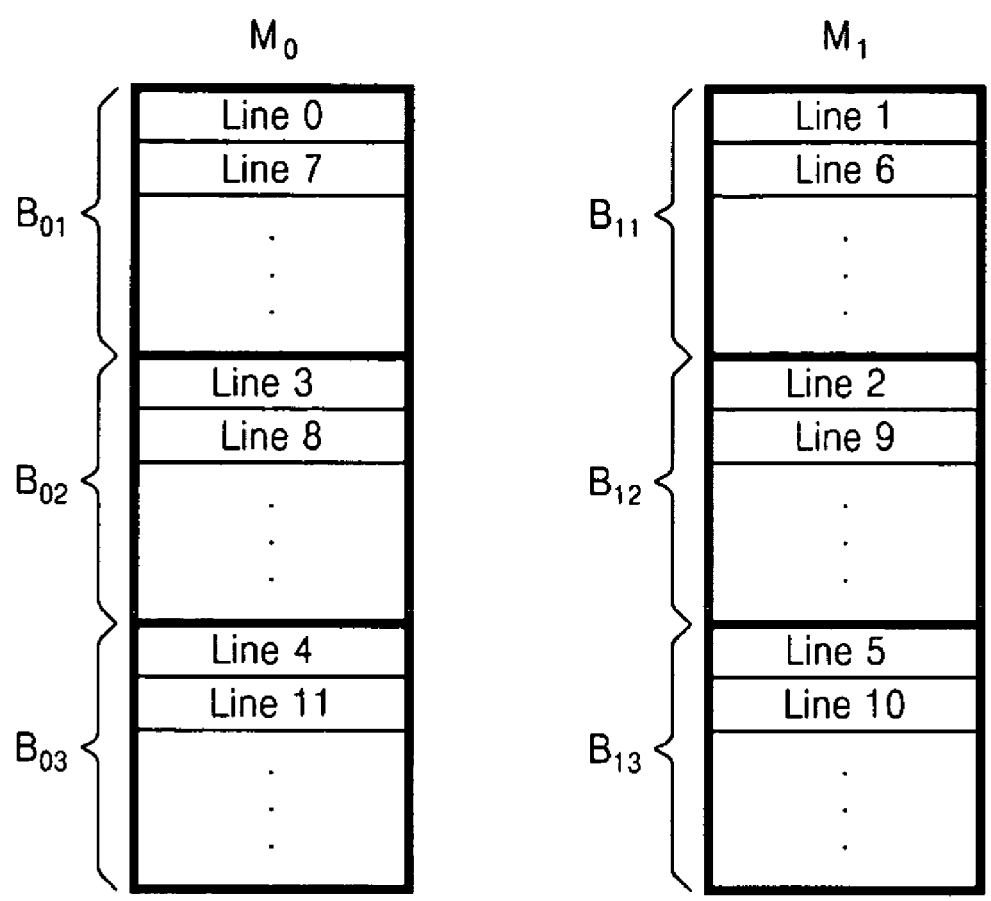

Referring to FIG. 5C, the memory M0 includes a bank B01, a bank B02 and a bank B03 and the memory M1 includes a bank B11, a bank B12 and a bank B13. The lines 0, 1, 2, 3, 4, 5, 6, 7, 8, 9, 10, 11, ... constructing the block data are sequentially mapped to the banks B01, B11, B12, B02, B03, B13, B11, B01, B02, B12, B13, B03, ..., respectively. When this mapping result is applied to FIG. 4A, the lines 0, 3, 4, 7, 8, 11, ... are written in the memory M0 and the lines 1, 2, 5, 6, 9, 10, ... are written in the memory M1. Thus, both the bus between the motion vector processor MP and the memory M1 and the bus between the motion vector processor MP and the memory M0 can be utilized even when only the even-numbered lines or only the odd-numbered lines are accessed when motion compensation is carried out in the frame mode or the field mode. Consequently, bus utilization efficiency is improved. Furthermore, the banks accessed when the lines are written (or read) are continuously switched to enable bank interleaving. This also improves bus utilization efficiency.

While each of the memories M0 and M1 includes two, three and four banks in FIGS. 5A, 5B and 5C, the number of banks of the memory is not limited to two, three and four. The present invention can be applied to memories having at least two banks.

Figure 6A:
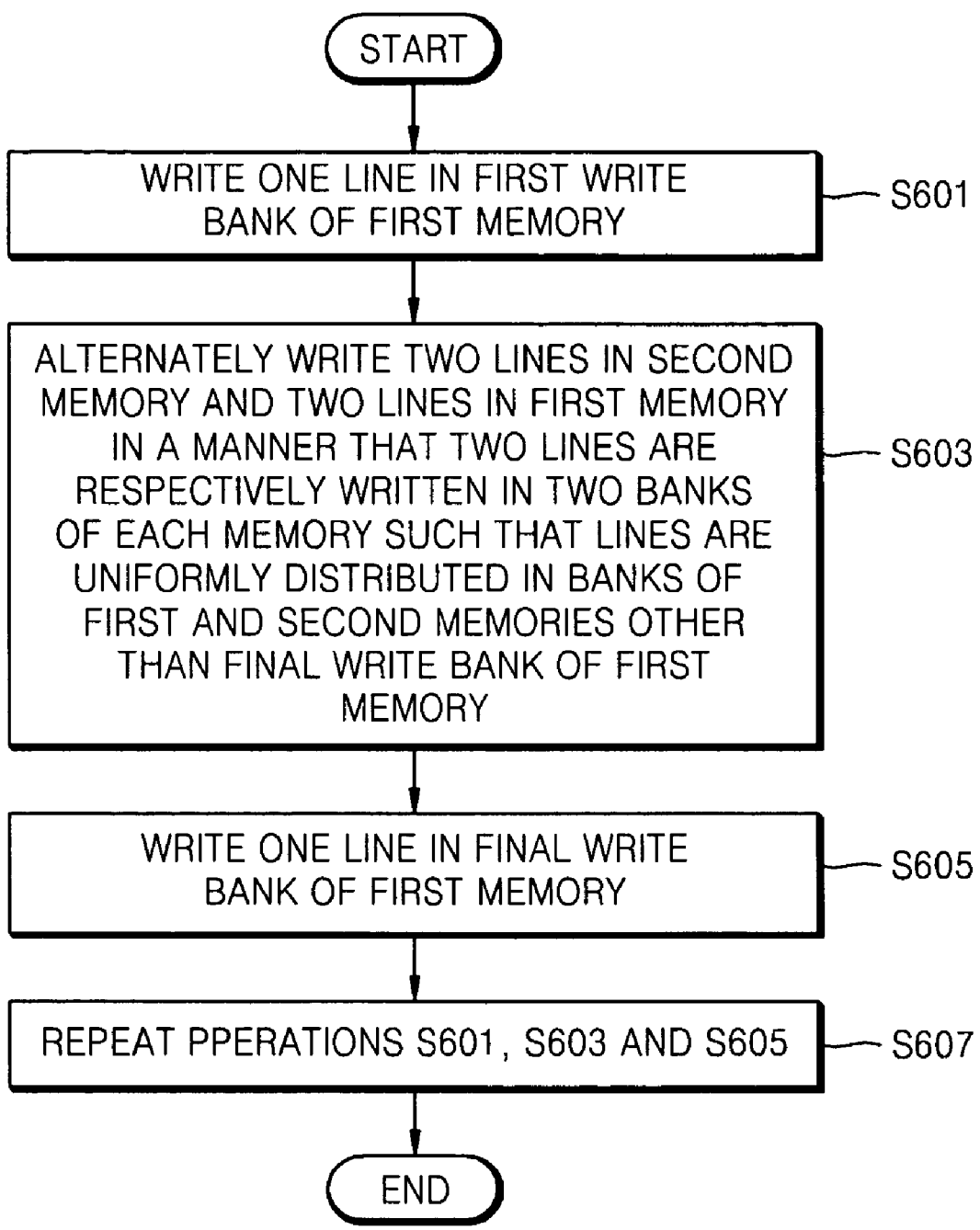
FIGS. 6A and 6B are flow charts illustrating a memory mapping method according to an exemplary embodiment of the present invention.
Figure 6B:
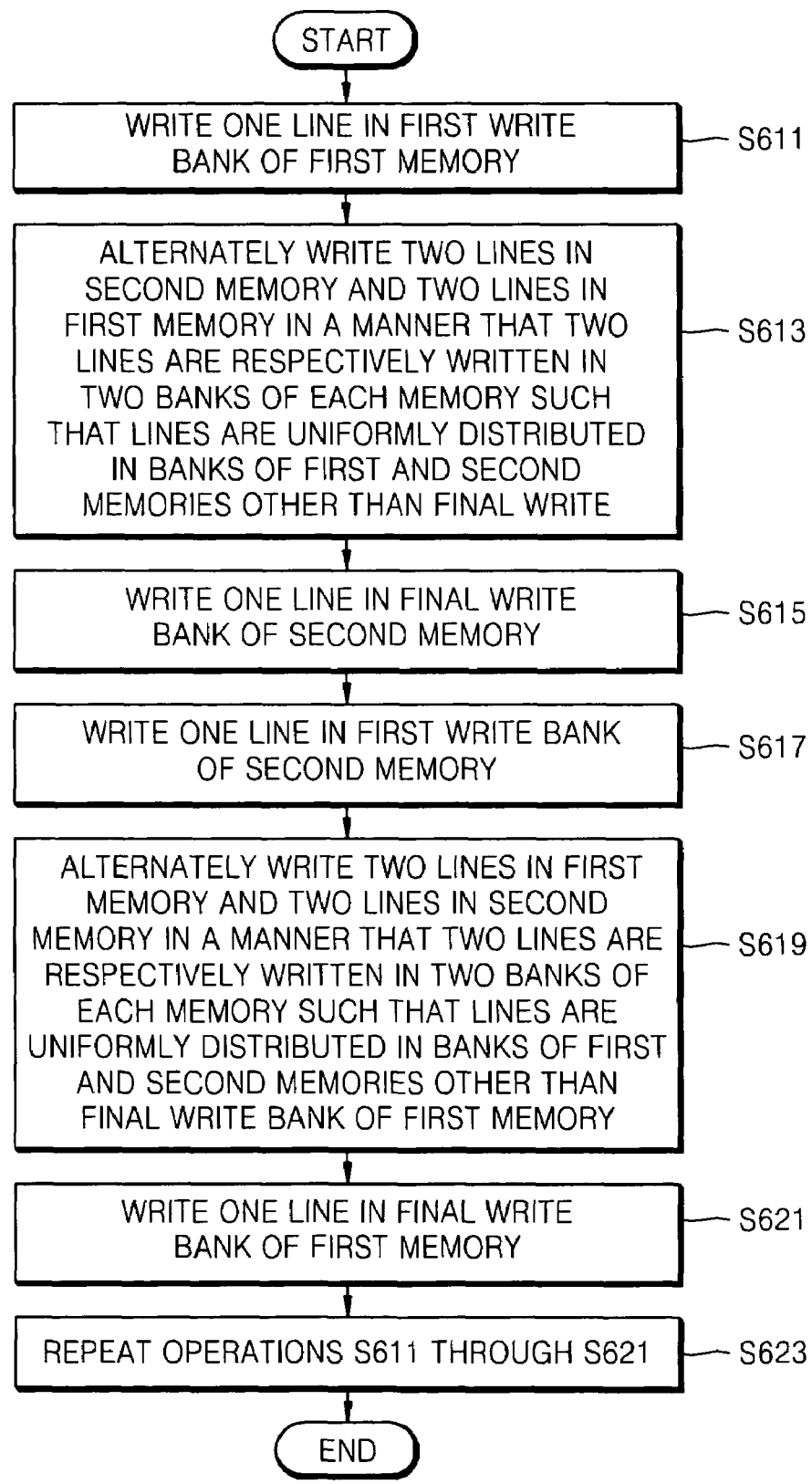

FIGS. 6A and 6B are flow charts illustrating a memory mapping method according to an exemplary embodiment of the present invention, wherein data composed of a plurality of lines is written in first and second memories each including at least two banks. FIG. 6A is a flow chart of a memory mapping method when each of the first and second memories includes an even number of banks and FIG. 6B is a flow chart of a memory mapping method when each of the first and second memories includes an odd number of banks.

Referring to FIG. 6A, one line is written in the first write bank of the first memory in operation S601. Here, the first write bank means a bank of a memory in which line data is initially written and corresponds to the bank B01 of FIG. 5B. When this operation is applied to the memory mapping format of FIG. 5B, line 0 is written in the bank B01.

In operation S603, two lines are written in the second memory and two lines are written in the first memory in such a manner that two lines are respectively written in two banks of the second memory and two lines are respectively written in two banks of the first memory. That is, groups of two lines of the block data are alternately written in the second memory and the first memory. In this manner, the lines of the block data are uniformly distributed in the banks of the first and second memories other than the final write bank of the first memory. Here, the final write bank of a memory means a bank in which the line data is finally written and corresponds to the bank B04 of FIG. 5B. When this operation is applied to the memory mapping format of FIG. 5B, the lines 1, 2, 3, 4, 5, 6, ... are sequentially written in the banks B11, B12, B02, B03, B13, B14, ..., respectively.

In operation S605, one line is written in the final write bank of the first memory. In the case of the memory mapping format of FIG. 5B, line 7 is written in the bank B04.

In operation S607, operations S601, 603 and 605 are repeated until all the lines are written in the first and second memories. That is, lines 8, 9, 10, 11, 12, 13, 14, 15, ... are sequentially written in the banks B01, B11, B12, B02, B03, B13, B14, B04, ..., respectively, in FIG. 5B.

The operations S601, 603, 605 and 607 are repeated until there is no line data left to be written.

A memory mapping method when each of the first and second memories includes an odd number of banks will be explained with reference to FIG. 6B.

In operation S611, one line is written in the first write bank of the first memory. When this operation is applied to the memory mapping format of FIG. 5C, line 0 is written in the bank B01.

In operation S613, two lines are written in the second memory and then two lines are written in the first memory in such a manner that two lines are respectively written in two banks of the second memory and two lines are respectively written in two banks of the first memory. That is, groups of two lines of the block data are alternately written in the second memory and the first memory. In this manner, the lines of the block data are uniformly distributed in the banks of the first and second memories other than the final write bank of the second memory. When this operation is applied to the memory mapping format of FIG. 5C, lines 1, 2, 3, 4, ... are sequentially written in the banks B11, B12, B02, B03, ..., respectively.

In operation S615, one line is written in the final write bank of the second memory. In the case of the memory mapping format of FIG. 5C, line 5 is written in the bank B13.

In operation S617, one line is written in the first write bank of the second memory. In the case of the memory mapping format of FIG. 5C, line 6 is written in the bank B11.

In operation S619, two lines are written in the first memory and then two lines are written in the second memory in a manner that two lines are respectively written in two banks of the first memory and two lines are respectively written in two banks of the second memory. That is, groups of two lines of the block data are alternately written in the first memory and the second memory. In this manner, the lines of the block data are uniformly distributed in the banks of the first and second memories other than the final write bank of the first memory. When this operation is applied to the memory mapping format of FIG. 5C, lines 7, 8, 9, 10, . . . are sequentially written in the banks B01, B02, B12, B13, . . . , respectively.

In operation S621, one line is written in the final write bank of the first memory. In the case of the memory mapping format of FIG. 5C, line 11 is written in the bank B03.

In operation S623, operations S611 through S621 are repeated until all the lines are written in the corresponding banks of the first and second memories.

Operations S611 through S623 are repeated until there is no line data left to be written.

Figure 7A:
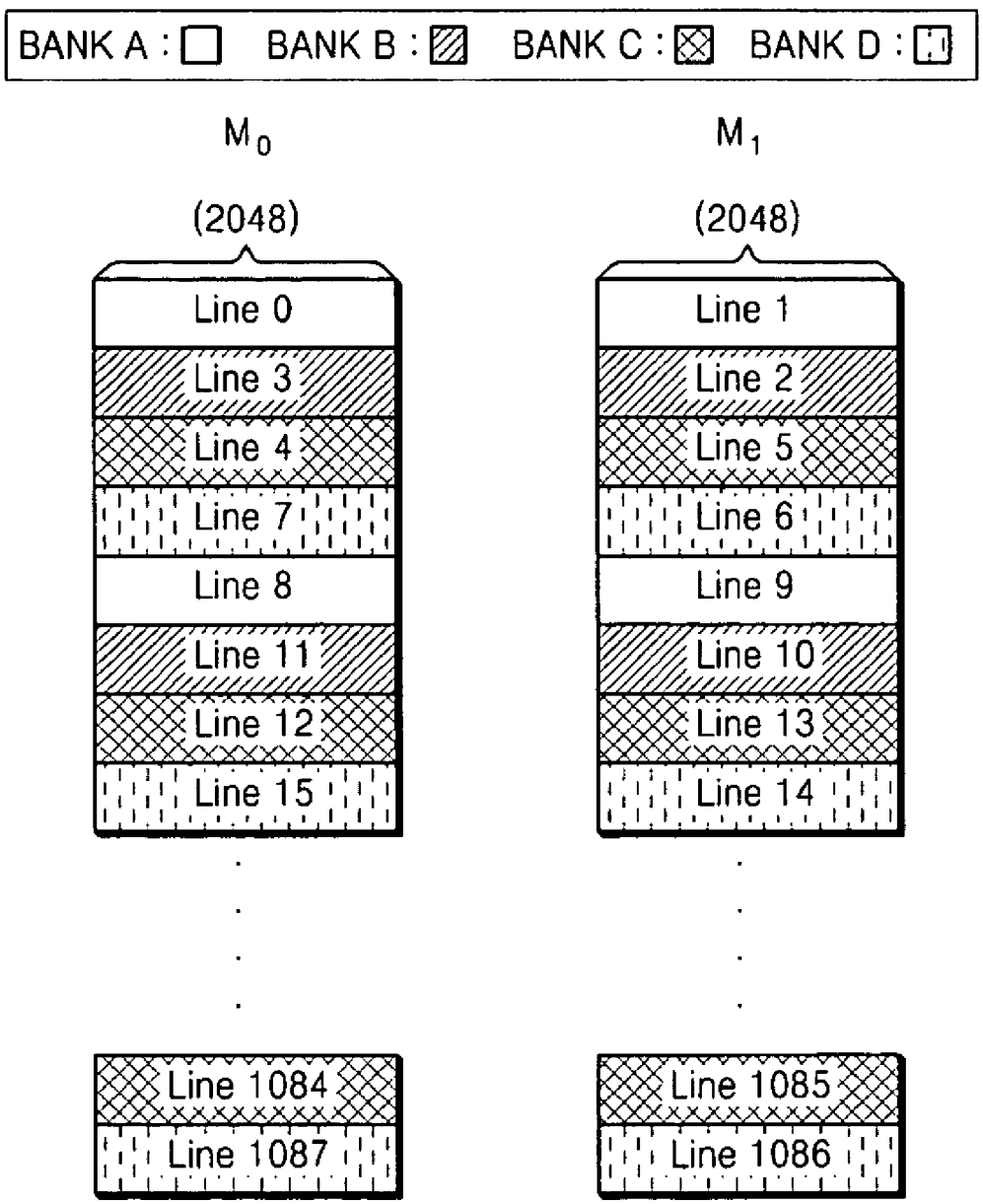
FIGS. 7A and 7B illustrate memory mapping formats in which lines constructing block data of an HD image are written in two memories according to an exemplary embodiment of the present invention.
Figure 7B:
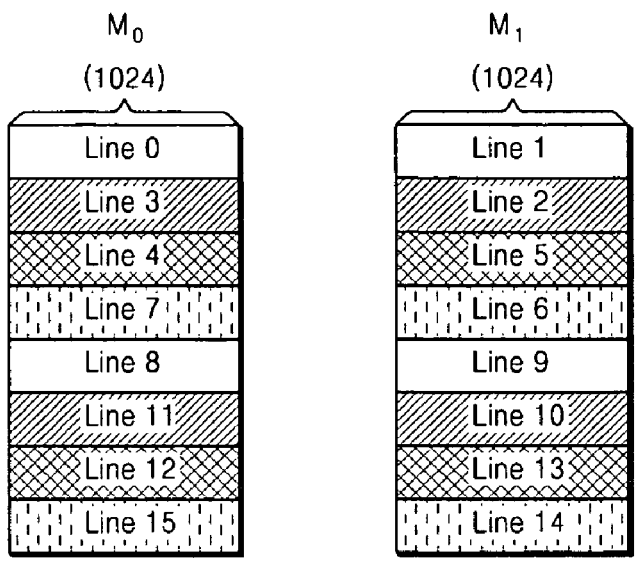
Figure 7B:
Figure 7B:
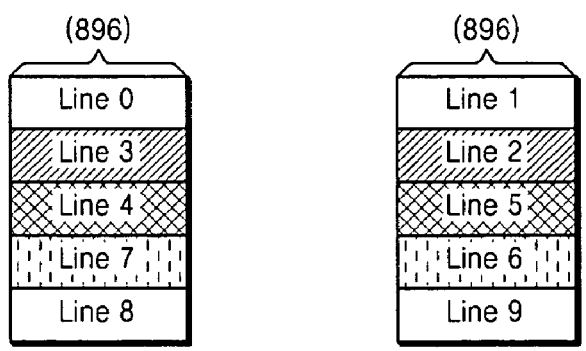
Figure 7B:

FIG. 7A illustrates a memory mapping format in which lines constructing block data of an HD image are written in two memories having a capacity of more than 512 Mbytes according to an exemplary embodiment of the present invention, and FIG. 7B illustrates a memory mapping format in which the lines of the block data of the HD image are written in two memories having a capacity of less than 512 Mbytes according to an exemplary embodiment of the present invention. In FIGS. 7A and 7B, each memory includes four banks.

The memory having a capacity of more than 512 Mbytes, illustrated in FIG. 7A, has a page size of 2048 bytes. In the case of an HD image, one line does not exceed the page size of the memory having a capacity of more than 512 Mbytes because one line has a size of 1920 bytes. Accordingly, the block data is written in the two memories in the same mapping format as that of FIG. 5(b), as illustrated in FIG. 7A. Accordingly, both a bus between a motion vector processor and one of the two memories and a bus between the motion vector processor and the other memory can be utilized even when only the even-numbered lines or only the odd-numbered lines are accessed when motion compensation is carried out in a frame mode or a field mode. Consequently, bus utilization efficiency is improved. Furthermore, the banks accessed when the lines are written (or read) are continuously switched to enable bank interleaving. This also improves bus utilization efficiency.

The memory having a capacity of less than 512 Mbytes, illustrated in FIG. 7B, has a page size of 1024 bytes. Thus, one line exceeds the page size of the memory because one line of the HD image has a size of 1920 bytes. Accordingly, block data corresponding to 1024 bytes×1082 lines is previously stored and then block data corresponding to 896 bytes×1080 lines is stored, as illustrated in FIG. 7B. However, the block data is written in the two memories in the same mapping format as the mapping format of FIG. 5B except that data corresponding to 128 bytes×1080 lines is not written in the regions of the memories in which the 896 bytes×1080 lines are written. Accordingly, both the bus between the motion vector processor and one of the two memories and the bus between the motion vector processor and the other memory can be utilized even when only the even-numbered lines or only the odd-numbered lines are accessed when motion compensation is carried out in a frame mode or a field mode. Consequently, bus utilization efficiency is improved. Furthermore, the banks accessed when the lines are written (or read) are continuously switched to enable bank interleaving. This also improves bus utilization efficiency.

According to the exemplary embodiments of the present invention, when block data composed of a plurality of lines is written in two memories, bank interleaving can be performed in the respective memories to improve bus utilization efficiency. Furthermore, two memory channels can be simultaneously used when the block data is written in the two memories so that channel utilization efficiency can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory mapping method for writing block data composed of a plurality of lines in first and second memories, wherein each of the first and second memories comprises a same number of banks greater than or equal to two, the method comprising:
   writing contiguous even-numbered lines in different banks of the different first and second memories and writing contiguous odd-numbered lines in different banks of the different first and second memories if the block data is motion-compensated in a frame mode or a field mode,
   wherein each of first and second memories have both even-numbered lines and odd-numbered lines written therein.

2. The method of claim 1, wherein the block data written in the first and second memories is divided into lines and sequentially read according to a use of the block data.

3. The method of claim 2, wherein the block data is used for motion compensation in the frame mode or the field mode.

4. A computer-readable recording medium having embodied thereon a computer program for performing a memory mapping method for writing block data composed of a plurality of lines in first and second memories, wherein each of the first and second memories comprises a same number of banks greater than or equal to two, the method comprising:
   writing contiguous even-numbered lines in different banks of the different first and second memories and writing contiguous odd-numbered lines in different banks of the different first and second memories, if the block data is motion-compensated in a frame mode or a field mode,
   wherein each of first and second memories have both even-numbered lines and odd-numbered lines written therein.

5. A memory mapping method for writing block data composed of a plurality of lines in first and second memories, wherein each of the first and second memories comprises a same number of banks in which a number of even banks is greater than two, the method comprising:
   writing one line in a first write bank of the first memory;
   alternately writing two lines in two banks of the second memory and two lines in two banks of the first memory such that lines of block data are uniformly distributed in the banks of the first and second memories other than a final write bank of the first memory;
   writing one line in the final write bank of the first memory; and
   repeating the writing of one line in the first write bank of the first memory, the alternately writing of two lines in two banks of the second memory and two lines in two banks of the first memory, and the writing of one line in the final write bank of the first memory,
   wherein the writing of the block data is stopped when there is no line data left to be written.

6. The method of claim 5, wherein the block data written in the first and second memories is divided into lines and sequentially read according to a use of the block data.

7. The method of claim 6, wherein the block data is used for motion compensation in a frame mode or a field mode.

8. A computer-readable recording medium having embodied thereon a computer program for performing a memory mapping method for writing block data composed of a plurality of lines in first and second memories, wherein each of the first and second memories comprises a same number of banks in which a number of even banks is greater than two, the method comprising:

writing one line in a first write bank of the first memory;

alternately writing two lines in two banks of the second memory and two lines in two banks of the first memory such that lines of block data are uniformly distributed in the banks of the first and second memories other than a final write bank of the first memory;

writing one line in the final write bank of the first memory; and repeating the writing of one line in the first write bank of the first memory, the alternately writing of two lines in two banks of the second memory and two lines in two banks of the first memory, and the writing of one line in the final write bank of the first memory, wherein the writing of the block data is stopped when there is no line data left to be written.

9. A memory mapping method for writing block data composed of a plurality of lines in first and second memories, wherein each of the first and second memories comprises a same number of banks, in which a number of odd banks is greater than three, the method comprising:

writing one line in a first write bank of the first memory;

alternately writing two lines in two banks of the second memory and two lines in two banks of the first memory such that lines of block data are uniformly distributed in the banks of the first and second memories other than a final write bank of the second memory;

writing one line in the final write bank of the second memory;

writing one line in a first write bank of the second memory;

alternately writing two lines in another two banks of the first memory and two lines in another two banks of the second memory such that lines of block data are uniformly distributed in the banks of the first and second memories other than a final write bank of the first memory;

writing one line in the final write bank of the first memory; and repeating the writing of one line in the first write bank of the first memory, the alternately writing of two lines in two banks of the second memory and two lines in two banks of the first memory, the writing of one line in the final write bank of the second memory, the writing of one line in the first write bank of the second memory, the alternately writing of two lines in another two banks of the first memory and two lines in another two banks of the second memory, and the writing of one line in the final write bank of the first memory, wherein the writing of the block data is stopped when there is no line data left to be written.

10. The method of claim 9 wherein the block data written in the first and second memories is divided into lines and sequentially read according to a use of the block data.

11. The method of claim 10, wherein the block data is used for motion compensation in a frame mode or a field mode.

12. A computer-readable recording medium having embodied thereon a computer program for performing a memory mapping method for writing block data composed of a plurality of lines in first and second memories, wherein each of the first and second memories comprises a same number of banks, in which a number of odd banks is greater than three, the method comprising:

writing one line in a first write bank of the first memory;

alternately writing two lines in two banks of the second memory and two lines in two banks of the first memory such that lines of block data are uniformly distributed in the banks of the first and second memories other than a final write bank of the second memory;

writing one line in the final write bank of the second memory;

writing one line in a first write bank of the second memory;

alternately writing two lines in another two banks of the first memory and two lines in another two banks of the second memory, such that lines of block data are uniformly distributed in the banks of the first and second memories other than a final write bank of the first memory;

writing one line in the final write bank of the first memory; and repeating the writing of one line in the first write bank of the first memory, the alternately writing of two lines in two banks of the second memory and two lines in two banks of the first memory, the writing of one line in the final write bank of the second memory, the writing of one line in the first write bank of the second memory, the alternately writing of two lines in another two banks of the first memory and two lines in another two banks of the second memory, and the writing of one line in the final write bank of the first memory, wherein the writing of the block data is stopped when there is no line data left to be written.

13. A memory mapping apparatus for writing block data composed of a plurality of lines in first and second memories, wherein each of the first and second memories comprises a same number of banks greater than or equal to two, the apparatus comprising a motion vector processor which writes contiguous even-numbered lines in different banks of the different first and second memories and writes contiguous odd-numbered lines in different banks of the different first and second memories, if the block data is motion-compensated in a frame mode or a field modes, wherein each of first and second memories have both even-numbered lines and odd-numbered lines written therein.

14. The apparatus of claim 13, wherein the block data written in the first and second memories is divided into lines and sequentially read according to a use of the block data.

15. The apparatus of claim 14, wherein the block data is used for motion compensation in a frame mode or a field mode.

16. A memory mapping apparatus for writing block data composed of a plurality of lines in first and second memories, wherein each of the first and second memories comprises a same number of banks in which a number of even banks is greater than two, the apparatus comprising a processor which:

writes one line in a first write bank of the first memory;

alternately writes two lines in two banks of the second memory and two lines in two banks of the first memory such that lines of block data are uniformly distributed in the banks of the first and second memories other than a final write bank of the first memory;

writes one line in the final write bank of the first memory; and repeats the writing of one line in the first write bank of the first memory, the alternately writing of two lines in two banks of the second memory and two lines in two banks of the first memory, and the writing of one line in the final write bank of the first memory, wherein the writing of the block data is stopped when there is no line data left to be written.

17. The apparatus of claim 16, wherein the block data written in the first and second memories is divided into lines and sequentially read according to a use of the block data.

18. The apparatus of claim 17, wherein the block data is used for motion compensation in a frame mode or a field mode.

19. A memory mapping apparatus for writing block data composed of a plurality of lines in first and second memories, wherein each of the first and second memories comprises a same number of banks in which a number of odd banks is greater than three, the apparatus comprising a processor which:

writes one line in a first write bank of the first memory;

alternately writes two lines in two banks of the second memory and two lines in two banks of the first memory such that lines of block data are uniformly distributed in the banks of the first and second memories other than a final write bank of the second memory;

writes one line in the final write bank of the second memory;

writes one line in a first write bank of the second memory;

alternately writes two lines in another two banks of the first memory and two lines in another two banks of the second memory such that lines of block data are uniformly distributed in the banks of the first and second memories other than a final write bank of the first memory;

writes one line in the final write bank of the first memory; and repeats the writing of one line in the first write bank of the first memory, the alternately writing of two lines in two banks of the second memory and two lines in two banks of the first memory, the writing of one line in the final write bank of the second memory, the writing of one line in the first write bank of the second memory, the alternately writing of two lines in another two banks of the first memory and two lines in another two banks of the second memory, and the writing of one line in the final write bank of the first memory, wherein the writing of the block data is stopped when there is no line data left to be written.

20. The apparatus of claim 19 wherein the block data written in the first and second memories is divided into lines and sequentially read according to a use of the block data.

21. The apparatus of claim 20, wherein the block data is used for motion compensation in a frame mode or a field mode.

* * * * *